United States Patent
Wang et al.

(10) Patent No.: US 11,394,404 B1
(45) Date of Patent: Jul. 19, 2022

(54) PARAMETER ESTIMATION WITH MACHINE LEARNING FOR FLASH CHANNEL

(71) Applicant: Seagate Technology LLC, Fremont, CA (US)

(72) Inventors: Zheng Wang, Louisville, CO (US); Ara Patapoutian, Hopkinton, MA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 56 days.

(21) Appl. No.: 17/150,861

(22) Filed: Jan. 15, 2021

(51) Int. Cl.
| | |
|---|---|
| *H03M 13/00* | (2006.01) |
| *H03M 13/39* | (2006.01) |
| *H03M 13/11* | (2006.01) |
| *G06N 20/00* | (2019.01) |
| *G11C 16/34* | (2006.01) |
| *G11C 16/30* | (2006.01) |
| *H03M 13/15* | (2006.01) |

(52) U.S. Cl.
CPC ........ *H03M 13/3927* (2013.01); *G06N 20/00* (2019.01); *G11C 16/30* (2013.01); *G11C 16/3404* (2013.01); *G11C 16/3495* (2013.01); *H03M 13/1105* (2013.01); *H03M 13/1168* (2013.01); *H03M 13/1575* (2013.01)

(58) Field of Classification Search
None
See application file for complete search history.

(56) References Cited

U.S. PATENT DOCUMENTS

| | | | |
|---|---|---|---|
| 6,615,387 B1 * | 9/2003 | Williamson | H03M 13/151 |
| | | | 714/784 |
| 8,995,074 B1 * | 3/2015 | Low | G11B 5/02 |
| | | | 360/53 |
| 9,563,502 B1 | 2/2017 | Alhussien et al. | |
| 10,388,394 B2 | 8/2019 | Tate et al. | |
| 10,475,523 B2 | 11/2019 | Sharon et al. | |
| 10,490,288 B1 | 11/2019 | Wang et al. | |
| 2016/0077914 A1 | 3/2016 | Zeng et al. | |
| 2019/0114228 A1 * | 4/2019 | Twitto | G06F 11/1072 |
| 2020/0241959 A1 | 7/2020 | Wang et al. | |

FOREIGN PATENT DOCUMENTS

EP 3579237 A1 12/2019

* cited by examiner

*Primary Examiner* — Mujtaba M Chaudry
(74) *Attorney, Agent, or Firm* — Holzer Patel Drennan

(57) ABSTRACT

Estimation of read parameters for a read channel of a solid-state storage device using a machine learning apparatus. The machine learning apparatus may be provided with signal count metrics from multiple regions of the memory cell signal space and syndrome weights from an error correction code. Other inputs may also be provided comprising metrics of the memory or read operations. In an example, the read parameters may include one or more reference threshold voltage values for read voltages applied to a memory cell and/or log-likelihood ratio (LLR) values for the memory cell.

20 Claims, 16 Drawing Sheets

PARAMETER ESTIMATION WITH MACHINE LEARNING FOR FLASH CHANNEL

BACKGROUND

Solid-state storage devices (e.g., flash storage devices) may use read channels comprising circuitry and modules that may apply a voltage to one or more transistors to determine a state of the transistor that is reflective of data stored therein. Such read channels may be parameterized such that various operational parameters associated with the read channel may be adjusted, which affect drive performance.

For example, in flash storage channels, a reference voltage threshold applied in a read process directly impacts the raw bit error rate of the data read from the solid-state storage device. An error correction code (ECC) such as a low-density parity-check (LDPC) code is usually implemented to correct read errors. Depending on the number of reads applied, hard data (from single read) or soft data (from multiple reads) for each bit is passed to an error correction decoder, usually in the form of a log-likelihood ratio (LLR). The choice of LLR values influences the LDPC decoding performance.

Accordingly, it is advantageous to select parameter values for a read channel of a solid-state memory device to improve the read performance of the device. By selecting or estimating optimized read parameters for the read channel of a solid-state device, the device performance may be improved by, for example, by minimizing a bit error rate (BER) of the read channel of the device.

SUMMARY

This disclosure relates to estimation of read channel parameters for a solid-state device. Specifically, the approaches described herein may use syndrome weights together with signal count metrics of soft read data, as inputs to a machine learning apparatus to estimate one or more read channel parameters to optimize drive performance (e.g., reduce or minimize a BER for the read channel). The read channel parameters may include a reference threshold voltage and/or LLR values to improve drive performance. In one example, the machine learning apparatus may estimate the read channel parameters for each codeword read from the solid-state memory device. Furthermore, additional inputs may be provided to the machine learning apparatus including, for example, program and/or read temperatures for the data to be read, program/erase cycle information, data retention time, and even page identifiers (ID).

Accordingly, the present disclosure includes estimating read channel parameters of a read channel in a solid-state storage device. The estimating includes determining signal count metrics associated with a codeword read from a solid-state storage device and obtaining a syndrome weight of an error correction code of a decoder of the read channel for the codeword. In turn, the estimating applies a machine learning technique having at least the signal count metrics and the syndrome weight as inputs to estimate one or more read channel parameters specific to the codeword as a result of the machine learning technique. In turn, data of the codeword may be read from the read channel of the solid-state storage device using the one or more read channel parameters. As will be discussed in greater detail below, the use of a machine learning apparatus for estimation of read parameter (e.g., threshold voltage values and/or LLR values) using signal count metrics and syndrome weights may provide significantly increased performance approaching performance associated with a priori knowledge of the data to be read.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

FIG. 1 schematically illustrates an example of a read channel of a solid-state memory device.

DETAILED DESCRIPTIONS

Figure 1:
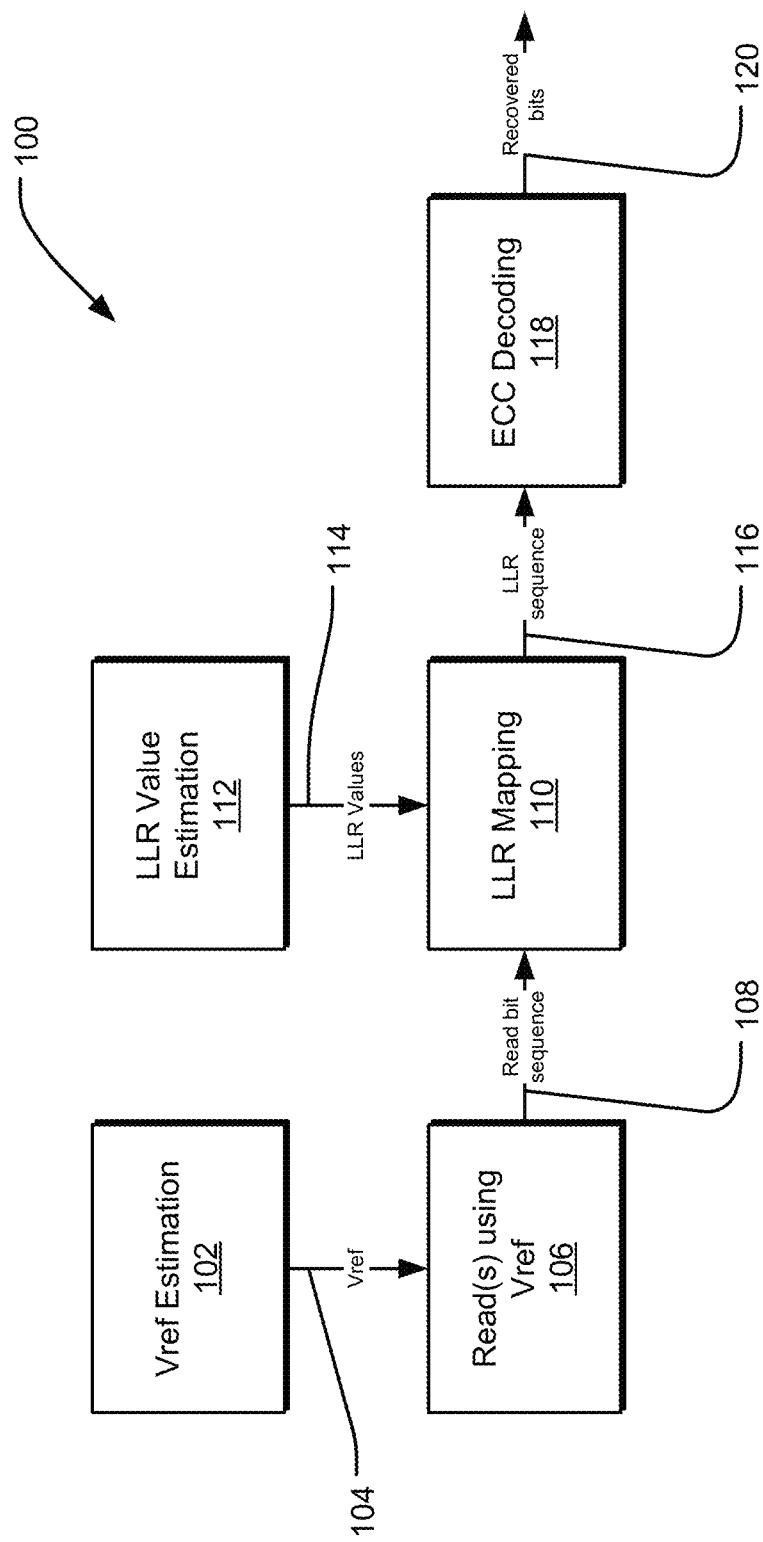

While the content of the present disclosure is susceptible to various modifications and alternative forms, specific embodiments are been shown by way of example in the drawings and are herein described in detail. It should be understood, however, that it is not intended to limit the scope of the disclosure to the particular form disclosed, but rather, the invention is to cover all modifications, equivalents, and alternatives falling within the scope as defined by the claims.

Illustrative embodiments will be described herein with reference to exemplary solid state storage devices and associated storage media, controllers, and other processing devices. It is to be appreciated, however, that these and other embodiments are not restricted to the particular illustrative system and device configurations shown. Accordingly, the term "solid-state storage device" as used herein is intended to be broadly construed, so as to encompass, for example, any storage device implementing the read parameter estimation techniques described herein. Numerous other types of storage systems are also encompassed by the term "solid state storage device" as that term is broadly used herein.

In one or more examples described herein, read parameter estimation techniques are provided that obtain metrics to customize one or more read parameters for data recovery from a solid-state storage device. In some embodiments, exemplary error recovery techniques are provided that process inputs to a machine learning apparatus to determine read parameters comprising (i) LLR values, and/or (ii) reference threshold voltage values for the codeword to be read from the storage device as discussed further below. The machine learning apparatus may comprise any appropriate machine learning module executed by a processor as will be described in greater detail below.

FIG. 1 illustrates an example read channel 100 for a solid-state memory device. The read channel 100 may include a reference threshold voltage value estimator 102. The reference threshold voltage value estimator 102 may estimate a reference threshold voltage value or "$V_{ref}$" 104 for a memory cell to be read by the read channel 100. The reference threshold voltage value $V_{ref}$ 104 may refer to a center voltage of a memory cell that delineates a first bit value from a second bit value. For example, in a single-level cell (SLC), the memory cell comprises a transistor that has two possible states. The first state is associated with a digital value of 0, whereas the second state is associated with a digital value of 1. The reference threshold voltage value may relate to the voltage value that distinguishes between the two states of the cell. However, in a multi-level cell (MLC) memory, a plurality of reference threshold voltage values may be provided between any corresponding number of memory states as will be described in greater detail below. In any regard, the reference threshold voltage value $V_{ref}$ 104 may be applied by a read module 106 to obtain hard bit information in a read bit sequence 106 composed of 0s and 1s from the memory cell.

The reference threshold voltage value $V_{ref}$ 104 affects the performance of the read channel 100. Specifically, the number of raw bit errors before any error correction measure is affected by the reference threshold voltage value $V_{ref}$ 104. The optimal reference threshold voltage value $V_{ref}$ 104 can be defined as the reference threshold voltage value $V_{ref}$ 104 value which minimizes the raw bit error rate in the read sequence. It is desired to have an estimation method which could closely track the optimal reference threshold voltage value $V_{ref}$ 104, regardless of the error correction measures that may be applied to the bit sequence 108.

However, even an optimal reference threshold voltage value $V_{ref}$ 104 does not always eliminate erroneous bits (errors) in the bit sequence 108. As such, an ECC, such as a LDPC code, is usually applied to the bit sequence 108 to correct any remaining errors in the bit sequence 108. To improve performance of the ECC, the raw bit sequence 108 may be first mapped into a log likelihood ratio (LLR) sequence 116 by a LLR mapping module 110, which is then passed into the ECC decoder 118 for recovery of recovered bits 120. The LLR mapping module 110 may, for example, utilize LLR values 114 provided by an LLR value estimator 112. The LLR values 114 generally indicate the confidence levels of the input bits from the bit sequence 180. In an example, the LLR values 114 may comprise a look up table (LUT) that may be provided with corresponding LLR values 114 to the LLR mapping module 110. The choice of the LLR values 114 can greatly impact the ECC decoding performance of the ECC decoder 118.

Accordingly, to increase performance of the read channel 100, optimized values of the reference threshold voltage value $V_{ref}$ 104 and LLR values 114 for the memory cell read by the read channel 100 are desired. As such, the present disclosure provides approaches that may be utilized by the reference threshold voltage value estimator 102 and/or LLR value estimator 112 to estimate optimized read channel parameters, such as values of the reference threshold voltage value $V_{ref}$ 104 and LLR values 114, to obtain recovered bits 120 with a reduced or minimized BER for the read channel 100. In relation to the estimation of the read channel parameters a number of metrics may be utilized by a machine learning apparatus. Such metrics are further illustrated with reference to FIGS. 2-6.

Figure 2:
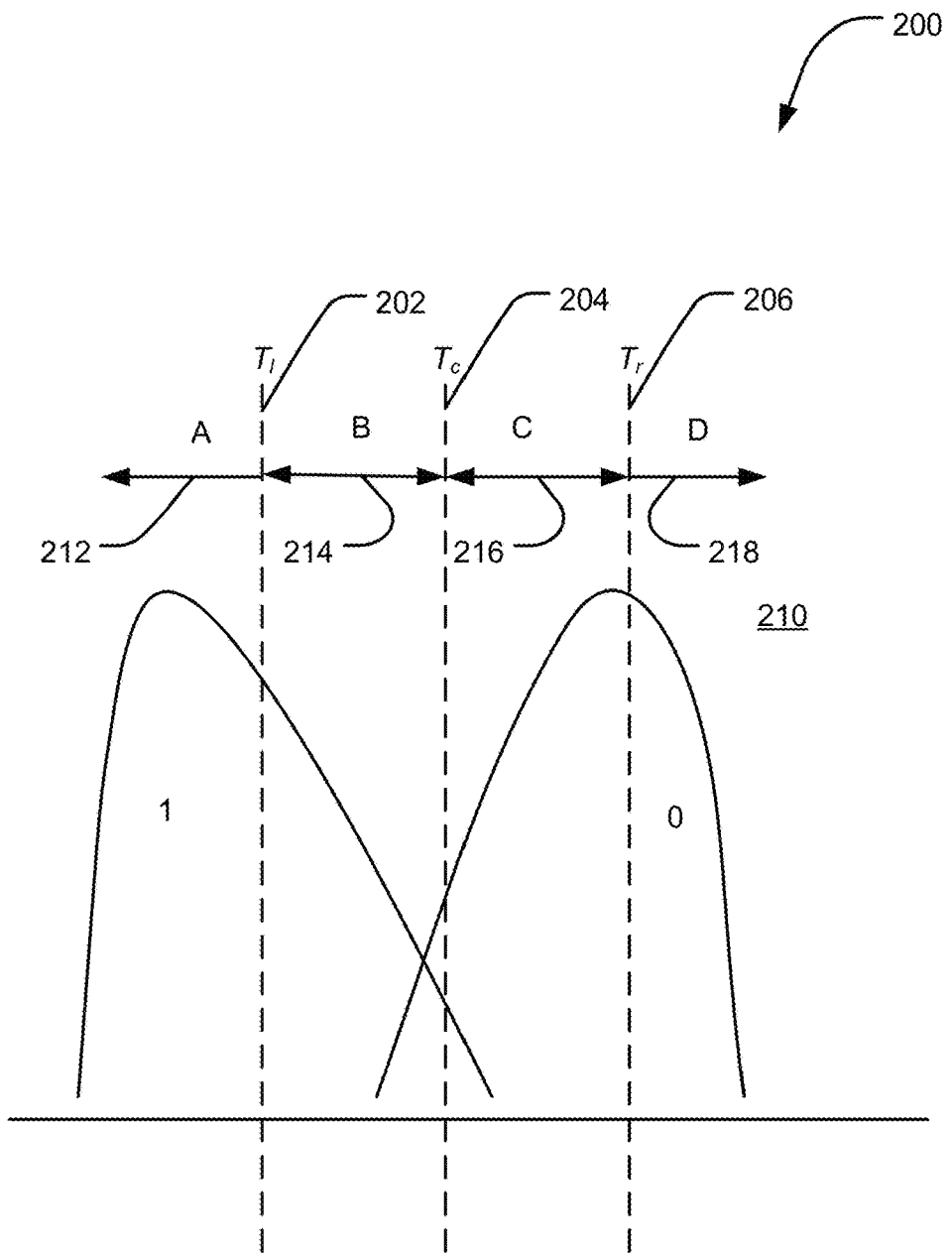
FIG. 2 illustrates an example of a series of reads of a solid state memory device.

For on-the-fly performance, data recovery is initially based on a single read of the memory cell read by the read channel 100. If the ECC decoder 118 fails to recover all the raw bits, additional reads may be issued. FIG. 2 illustrates an example of three reads on an SLC memory cell 200. In FIG. 2, $T_c$ 204, $T_l$ 202, and $T_r$ 206 represent center, left-shoulder and right-shoulder reads respectively. The various reads, $T_c$ 204, $T_l$ 202, and $T_r$ 206, partition the signal space 210 into multiple regions. Specifically, $T_c$ 204, $T_l$ 202, and $T_r$ 206 divide the signal space 210 into region A 212, region B 214, region C 216, and region D 218. In turn, a signal count metric for each respective region is defined as the number of bits falling in that region. In the example shown in FIG. 2, the signal count of each of region A 212, region B 214, region C 216, and region D 218 can be represented by $S_A$, $S_B$, $S_C$ and $S_D$, respectively. The signal count metrics for the regions provide an insight on the reference threshold voltage value $V_{ref}$ location with respect to the optimum, as well as the reliability of the bits falling in each respective regions. For example, if $S_B \approx S_C$, the reference threshold voltage value $V_{ref}$, which in FIG. 2 corresponds to the read voltage for the center read $T_c$ 204, is likely to be close to optimal value and the bits falling in B and C have similar reliability level. In contrast, if $S_B \ll S_C$, $T_c$ 204 is likely to locate to the right of the optimal value and the bits falling in C might have higher reliability level than those in B.

Figure 3:
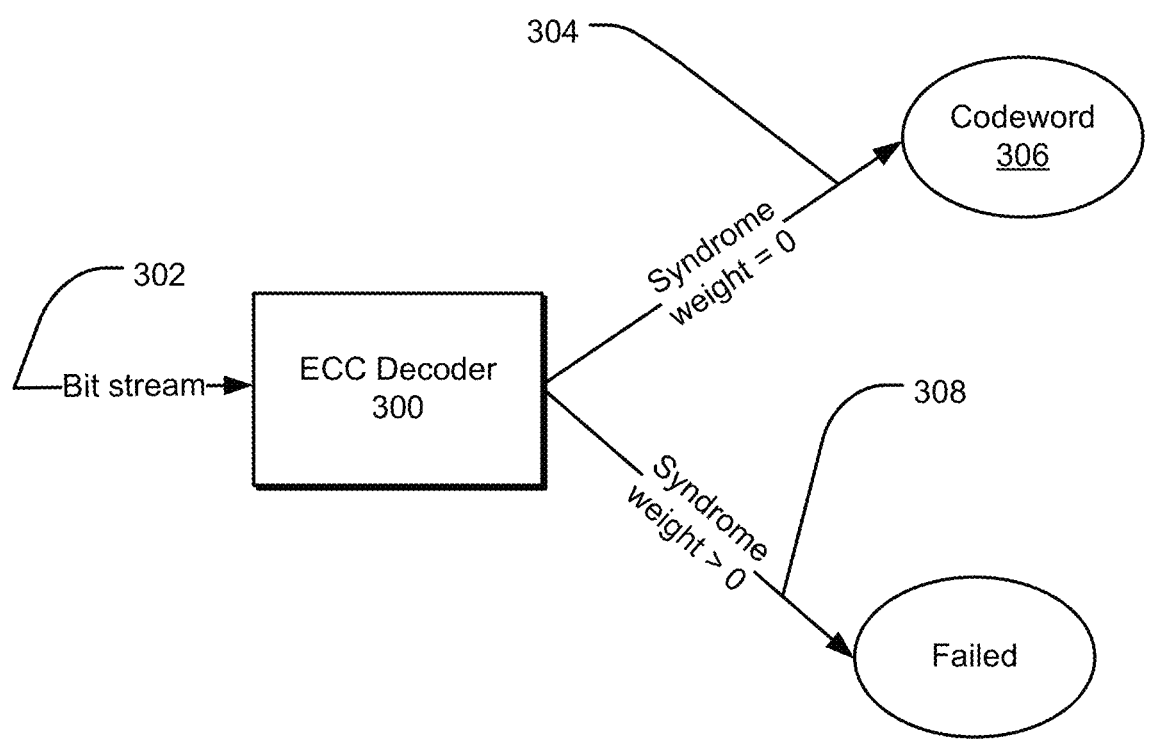
FIG. 3 illustrates an example of an ECC decoder receiving data from a solid-state memory device in which the ECC decoder either successfully decodes the codeword or fails to decode the codeword and provides a syndrome weight value associated with the failure.

With further reference to FIG. 3, syndrome weight is another important metric related to the performance of the read channel 100. Syndrome weight may refer to the number of check nodes that fail to converge after ECC decoding (e.g., by ECC decoder 118 in FIG. 1). As shown in FIG. 3, if an ECC decoder 300 recovers 304 a codeword 306 from a bit stream 302 successfully, the syndrome weight at the output of the ECC decoder 300 is 0. However, if the ECC decoder 300 fails 308 to recover the codeword 306, the syndrome weight is a positive integer. Syndrome weight may be a function of ECC iteration number (e.g., LDPC iteration number). Syndrome weight, especially raw syndrome weight obtained before any ECC decoding effort, is a good indicator of raw bit error rate in the bit stream 302.

In addition, other memory metrics may also have direct or indirect implication of the key parameters, such as program/erase cycle (PEC), data retention time, program/read temperature, location ID (e.g., page/die/block number), open/close block, read disturb, etc.

Figure 4:
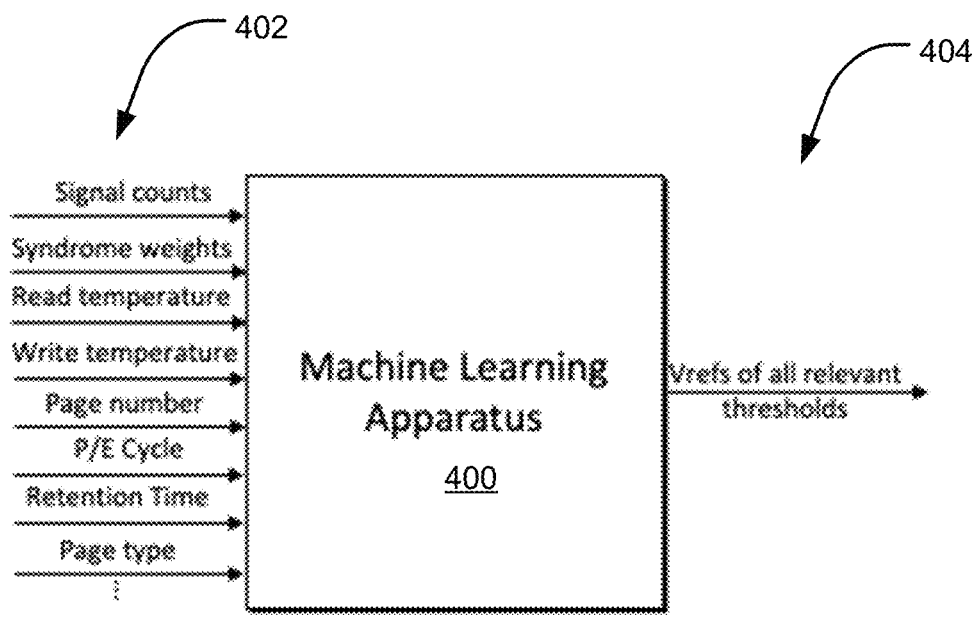
FIG. 4 illustrates an example of a machine learning apparatus receiving various inputs regarding the read data to provide an output of one or more reference threshold voltages for the codeword to be read.
Figure 5:
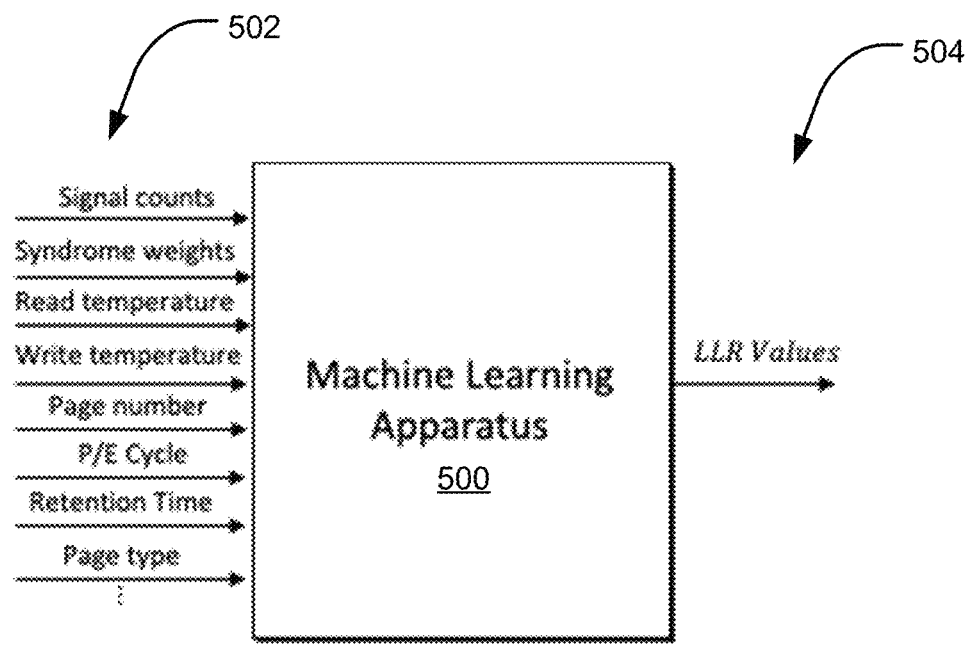
FIG. 5 illustrates an example of a machine learning apparatus receiving various inputs regarding the read data to provide an output of one or more LLR values for the codeword to be read.

With further reference to FIGS. 4 and 5, the present disclosure generally relates to use of one or more of the foregoing metrics as an input to a machine learning apparatus to determine one or more estimated read parameters for the solid-state storage device from which data is read. As an example, the estimated read parameters may include a reference threshold voltage value $V_{ref}$ and/or LLR values (e.g., a LLR LUT).

The aforementioned metrics impact the read parameter estimation in different ways. It is presently recognized that manually designing an estimation apparatus which incorporates many useful metrics is prohibitively challenging. As such, prior approaches have generally failed to take full advantage of available information. For instance, prior approaches included use of static values for reference threshold voltage value and/or LLR values when reading data from a memory. Further still, some approaches employing polynomial curve fitting have been proposed that only utilize signal metrics in the curve fitting to determine read parameters. In either instance, the approaches employed limited information and, as a result, did not provide optimized read parameter estimation.

A machine learning apparatus, on the other hand, is capable of extracting information from multiple inputs without specifying explicit rules governing the interactions or relationships between the inputs. Of note, the use of a machine learning apparatus may allow for robust analysis that is performed quickly and efficiently. As such, the estimated read parameters may be estimated for a given memory cell to be read, providing granular estimation of the read parameters rather than use of generic or compromised values for a plurality of memory cells.

Figure 6:
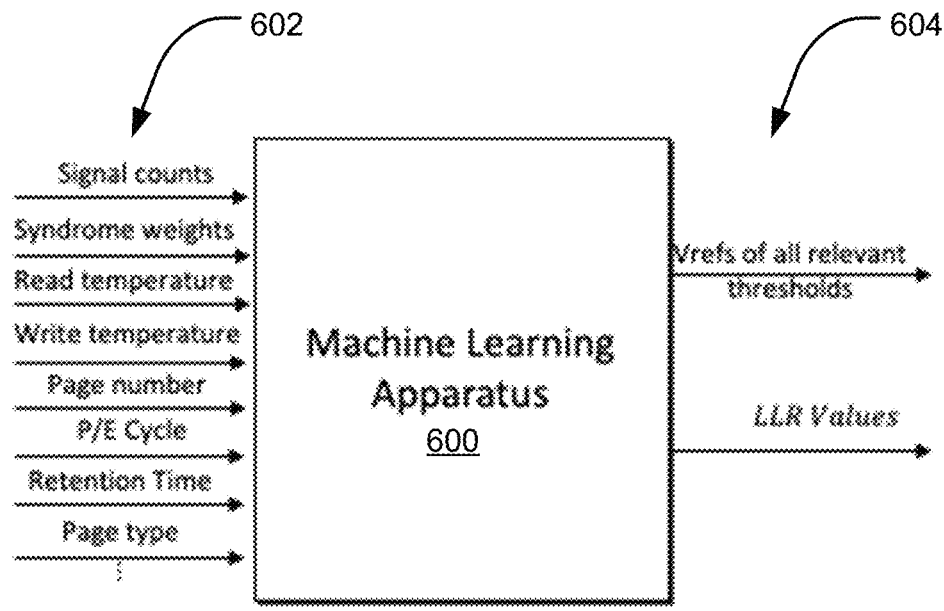
FIG. 6 illustrates an example of a machine learning apparatus receiving various inputs regarding the read data to provide an output including one or reference threshold voltage values and one or more LLR values for the codeword to be read in a single machine learning operation.

FIG. 4 shows a general structure of reference threshold voltage value estimation using a machine learning apparatus. FIG. 5 shows a general structure of LLR value estimation using a machine learning apparatus. FIG. 6 shows a general structure for both reference threshold voltage value and LLR value estimation using a machine learning apparatus.

In FIG. 4, a machine learning apparatus 400 receives multiple inputs 402 to estimate relevant reference threshold voltage values 404. As way of illustration and not limitation, such inputs 402 may include signal count metrics as described above, syndrome weights as described above, read/write temperature, page number, program/erase cycle, data retention time, page type, etc. In any regard, the inputs 402 are passed through the machine learning apparatus 402 which generates the estimation of all relevant reference threshold voltage values 404 for the memory to be read.

In FIG. 5, a machine learning apparatus 500 receives multiple inputs 502 to estimate LLR values 504. As way of illustration and not limitation, such inputs 502 may include signal count metrics as described above, syndrome weights as described above, read/write temperature, page number, program/erase cycle, data retention time, page type, etc. In any regard, the inputs 502 are passed through the machine learning apparatus 502 which generates the estimation of LLR values 504 for the memory to be read.

In FIG. 6, a machine learning apparatus 600 receives multiple inputs 602 to estimate read parameters 604 that include both relevant reference threshold voltage values and LLR values. As way of illustration and not limitation, such inputs 602 may include signal count metrics as described above, syndrome weights as described above, read/write temperature, page number, program/erase cycle, data retention time, page type, etc. In any regard, the inputs 502 are passed through the machine learning apparatus 600 which generates the estimation of the read parameters 604 for the memory to be read.

As may be appreciated, any appropriate machine learning technique or approach may be utilized by any of the machine learning apparatuses described herein. However, a specific machine learning approach comprising a neural network approach is illustrated herein for reference. However, any machine learning or other artificial intelligence approach that allows multiple inputs to be used to solve for optimized values may be provided without limitation (e.g., including a Random Forest approach).

Figure 7:
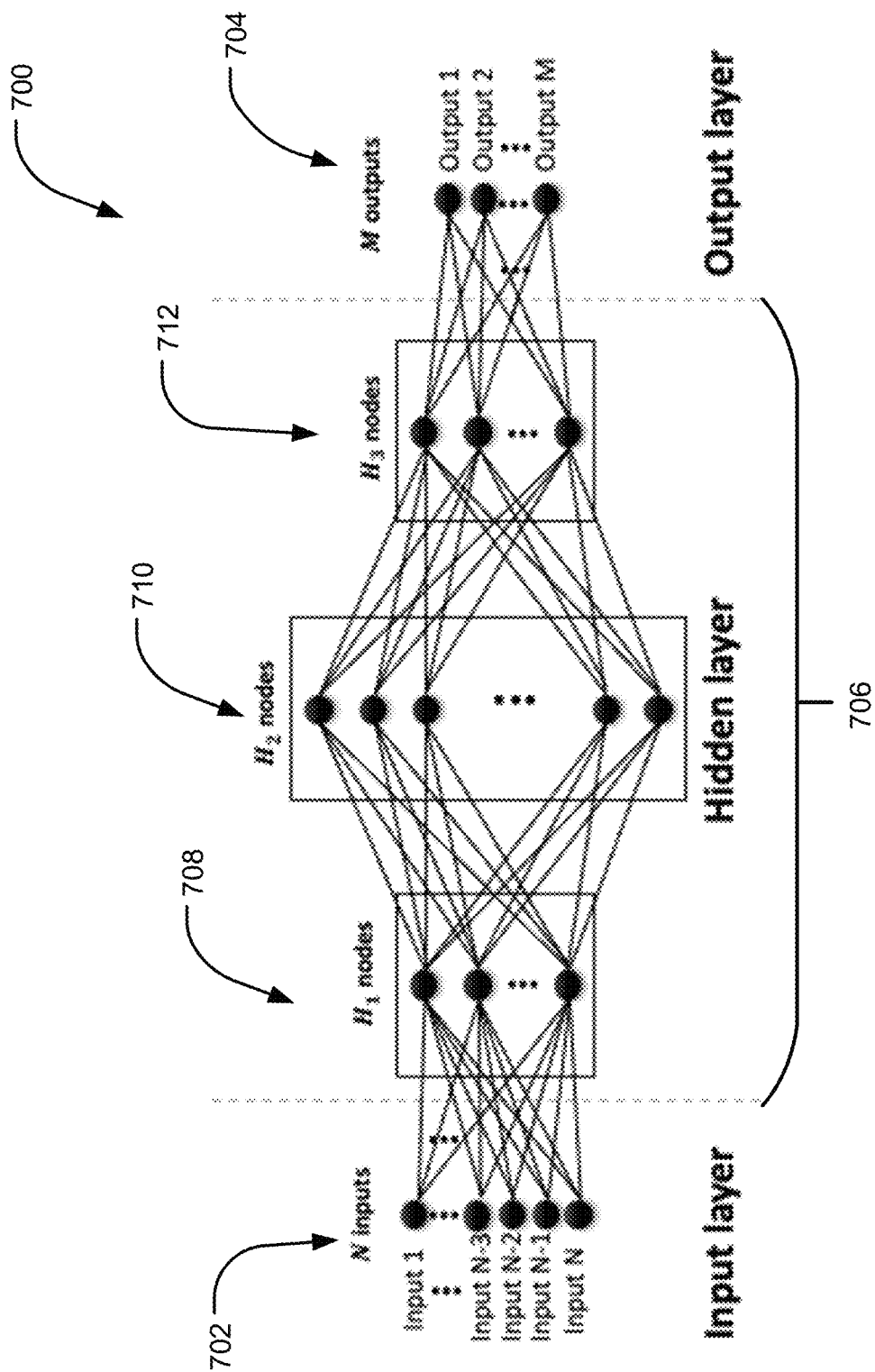
FIG. 7 illustrates an example of a neural network that may be used as a machine learning apparatus in the present disclosure.

As shown in FIG. 7, a fully connected feedforward neural network 700 is illustrated. The neural network 700 includes N input nodes 702. The neural network 700 also includes M output nodes 704. The neural network 700 may also include a hidden layer 706. The hidden layer comprises various hidden layers 706 each comprising hidden nodes. In this example, a first hidden layer 708, a second hidden layer 710, and a third hidden layer 712 are provided with $H_1$, $H_2$, and $H_3$ hidden nodes, respectively.

Figure 8:
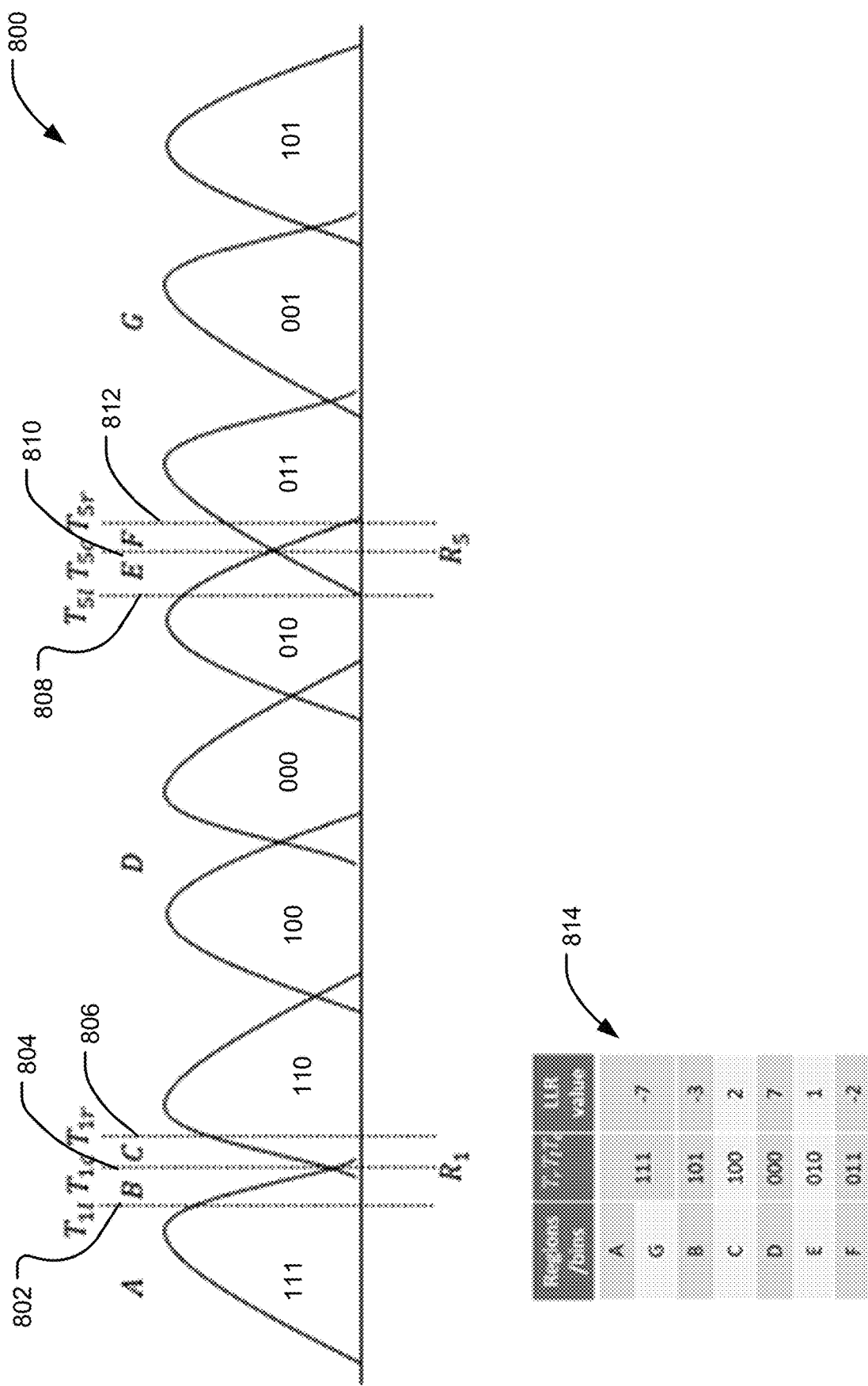
FIG. 8 illustrates an example of a plurality of read operations on a solid-state memory device with a corresponding LLR look up table.

For error recovery, multiple reads may be applied to a memory cell to be read. FIG. 8 illustrates an example of a triple-level cell (TLC) NAND flash memory page. Specifically, FIG. 8 illustrates a signal space 800 for the TLC memory page. A least significant bit (LSB) read may be issued to the TLC memory cell. As the LSB read determines the least significant bit of the three bit encoded memory value, two reference threshold voltage values, $T_1$ and $T_5$ are provided to discern the state of the memory between states in which the LSB varies. For each of the two reference threshold voltage values $T_1$ and $T_5$, three reads are performed as left-shoulder, center, and right-shoulder reads. That is, for $T_1$, a left-shoulder read $T_{1l}$ 802, a center read $T_{1c}$ 804, and a right-shoulder read $T_{1r}$ 806 are performed. For $T_5$, a left-shoulder read $T_{5l}$ 808, a center read $T_{5c}$ 810, and a right-shoulder read Tyr 812 are performed. The three reads for the two respective reference threshold voltage values partition the signal space into regions A, B, C, D, E, F and G as illustrated. Each region can be labeled by the read of three reads, as shown in the LLR table 814 of FIG. 8. Note that regions A and G are not differentiable, and are both labeled as "111." The bits falling in each region are then mapped to an LLR value to represent an estimation and the estimation's corresponding reliability level. If two or more regions share the same labelling, the bits from these regions also share the same LLR values. The definition of LLR value in region X is as follows:

$$\text{LLR}(X) = \log \text{ number of bits read in } X \text{ that were programmed as "0"/number of bits read in } X \text{ that were programmed as "1"} \qquad \text{Equation 1}$$

Choice of LLR values has large impact on the ECC decoding performance. Without the knowledge of programmed data, a pre-determined LLR LUT is usually applied for such mapping (e.g., as disclosed in U.S. Pat. Pub. No. 2020/0241959, the entirety of which is incorporated herein by reference. Such pre-determined LLR values allow some LLR values can be estimated for the solid-state memory device using the aforementioned signal count metrics. The estimation is accomplished through linear or polynomial fitting. The shortcoming of a pre-determined LUT is that the values are static and cannot be customized to individual codeword.

Figure 9:
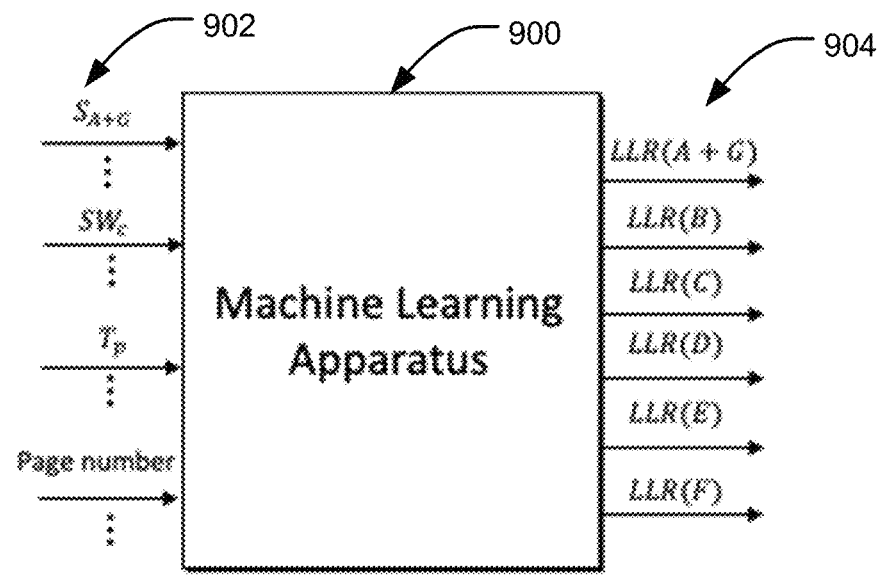
FIG. 9 illustrates an example machine learning apparatus for receiving inputs related to a codeword to be read and that outputs a plurality of LLR values related to the codeword.

In contrast, a neural network is able to take multiple metrics as input to extract more information for LLR value estimation. As shown in FIG. 9, a machine learning apparatus 900 is provided which may provide estimated LLR values for the LLR table 814 of FIG. 8. That is, the output 904 of the neural network 900 may be the LLR values of the six regions of FIG. 8 as illustrated in the table 814 of FIG. 8. Specifically, those LLR values may be: LLR(A+G), LLR(B), LLR(C), LLR(D), LLR(E), and LLR(F). The input 902 of the neural network can be chosen from any appropriate metric as described above. Those metrics may include, for example, signal count metrics and syndrome weights (e.g. from center, left, and right reads). Additionally, the metrics comprising the inputs 902 may include test conditions that may include program temperature for the data, read temperature for the data, data retention time, or program/erase cycle. Further still, the metric used for the input to the neural network may include page ID information including, for example, page number and/or page type (e.g. LSB, central significant bit (CSB), and/or most significant bit (MSB)). The number of input can be a subset of this list or be expanded by adding other useful information.

Figure 10:
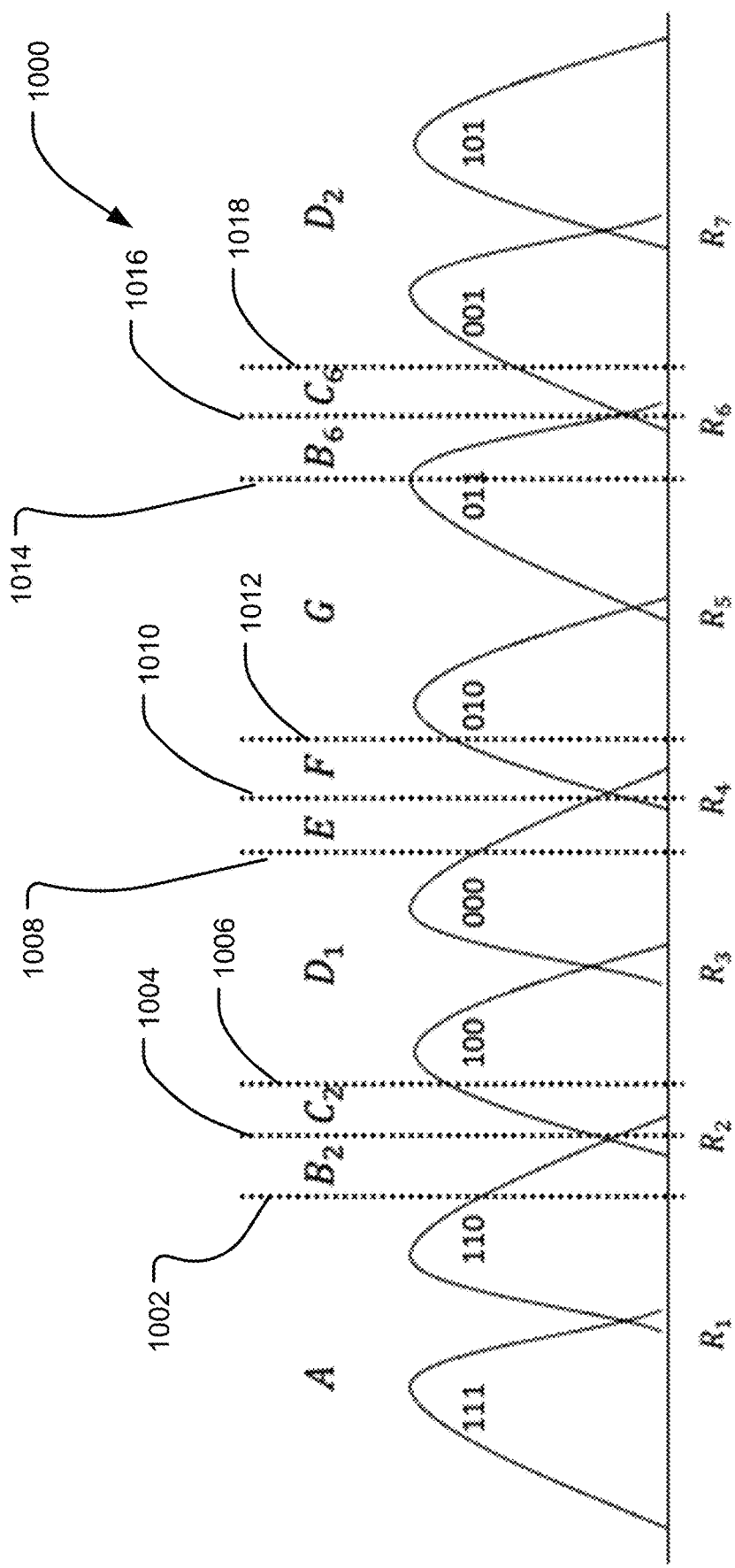
FIG. 10 illustrates an example signal distribution of a triple level cell (TLC) memory on which three reads are performed.

The training process for a neural network may include adequate amount of offline training data. Each training codeword may be labeled with the optimal LLR values for different regions, calculated by the definition in Equation 1 above using the knowledge of programmed/genie data. For the combined region A+G, the LLR value labeling can be obtained by averaging the optimal LLR values of the two individual regions. Some other page or NAND types may involve more than two thresholds. For example, FIG. 10 illustrates a TLC memory cell on which a CSB read is performed. As the signal space 1000 for the TLC memory cell includes three locations at which the CSB is affected, three thresholds are provided for each read. For each of the thresholds, a left-should read, a center read, and a right-shoulder read are issued. That is, for the first threshold, a left-should read 1002, a center read 1004, and a right-shoulder read 1006 are issued. For the second threshold, a left-should read 1008, a center read 1010, and a right-shoulder read 1012 are issued. For the third threshold, a left-should read 1014, a center read 1016, and a right-shoulder read 1018 are issued. As described above, the various reads establish regions in the signal space for which signal count metrics may be determined. In FIG. 10, because the CSB reads include more thresholds, more regions may share the same LLR values with others due to the confusion in labelling. In this example, the available signal counts may be $S_{A+G}$, $S_{B_2+B_6}$, $S_{C_2+C_6}$, $S_E$, $S_F$, and $S_{D_1+D_2}$. The similar LLR averaging technique can be applied to label the training data.

Hyper-parameter tuning for a neural network may also be provided. Hyper-parameter tuning may include choice/optimization of various functions (e.g., cost function, activation function, optimizer, etc.), training epochs, and learning rate, etc.

Figure 11:
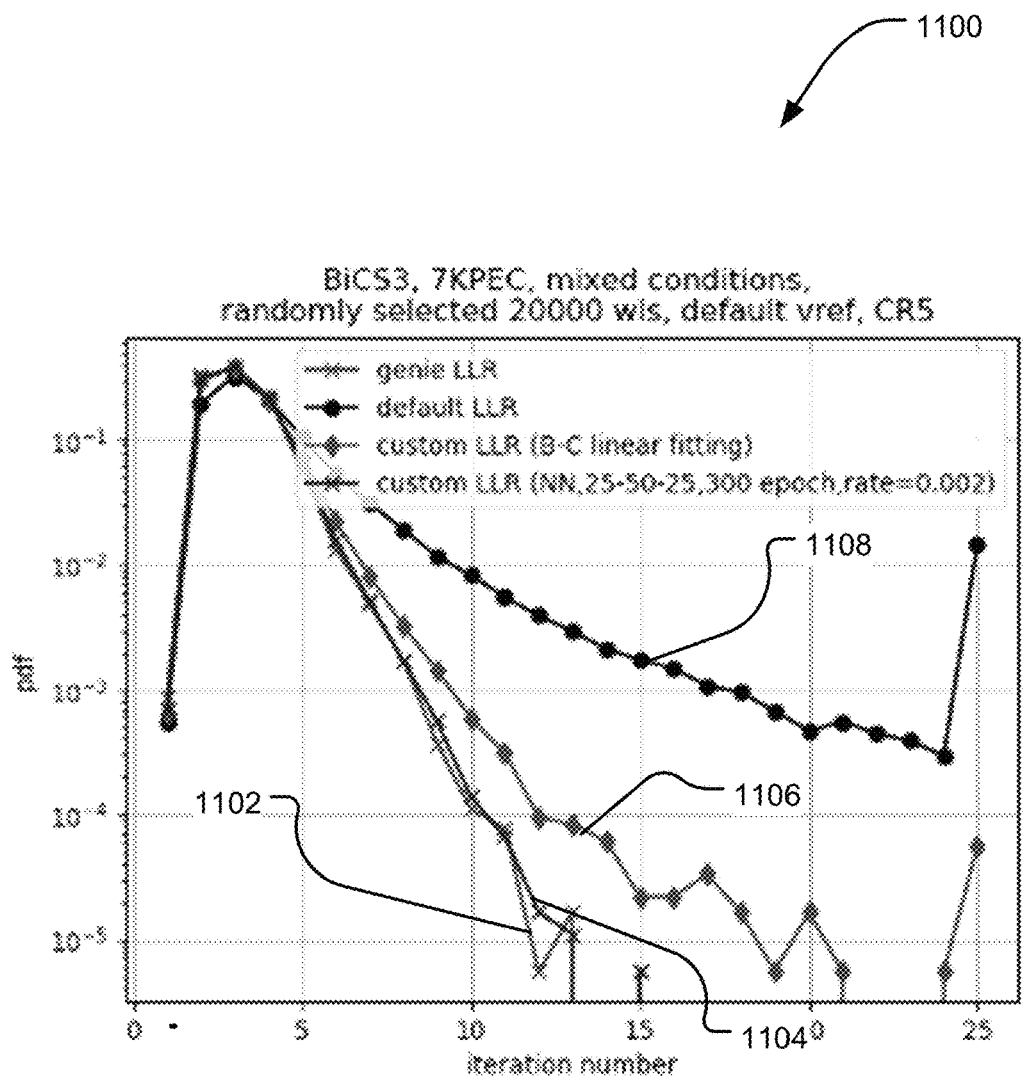
FIG. 11 illustrates a graph demonstrating performance of the approach of the present disclosure relative to alternative approaches for LLR value estimation.

The performance of LLR estimations obtained from a neural network is shown in FIG. 11. In FIG. 11, the chart 1100 illustrates probability density function (PDF) along the vertical axis and the iteration number upon convergence of the ECC decoder on the horizontal axis. The maximum number of iteration may be set to a given value (e.g., 25). The results generally compares the ECC iteration number distribution with various methods representative of LLR value estimation. The proposed method shows significant improvement comparing to the other two methods.

Plot 1102 represents performance of an idealized scenario in which genie data is used to determined optimized LLR values from a priori knowledge of the data to be read. Plot 1104 represents performance of a machine learning apparatus as described herein in which at least signal count metrics and syndrome weights are provided to a neural network to provide estimated LLR values. As can be appreciated, the plot 1104 closedly tracks the performance of the idealized scenario in plot 1102. The neural network utilized to generate the plot 1104 in FIG. 11 has 25, 50 and 25 nodes for the three hidden layers as shown in FIG. 7, respectively. Plot 1106 illustrates use of a traditional polynomial curve-fitting technique, which as can be appreciated, significantly underperforms the machine learning approach represented in plot 1104. Plot 1108 is representative of use of static LLR LUTs with values.

Figure 12:
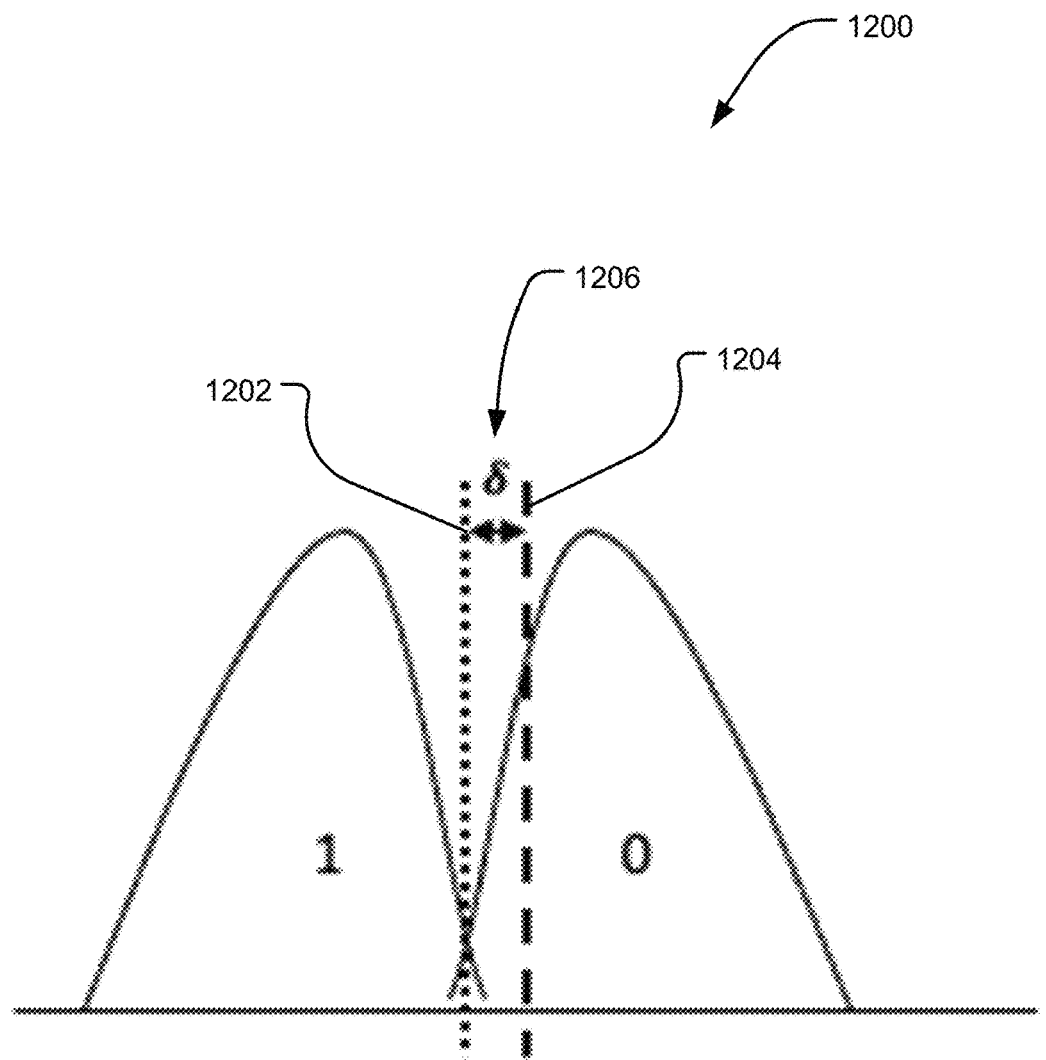
FIG. 12 illustrates a reference threshold voltage for a memory cell relative to an optimal threshold of the memory cell.

A machine learning apparatus such as neural network shown in FIG. 7 may also be used to estimate a reference threshold voltage value. For example, FIG. 12 illustrates a signal space 1200 for a SLC memory cell. As shown in FIG. 12, when reading from the memory cell, a reference threshold voltage value 1204 is applied. A "0" or "1" is generated depending on how the read voltage is compared to the reference threshold voltage value 1204. The optimal reference threshold voltage value 1202 is defined as the reference threshold voltage value that minimize the bit errors. A voltage offset (denoted by δ 1206) is defined as the difference between the actually applied reference threshold voltage value 1204 and the optimal reference threshold voltage value 1202.

A similar technique related to a machine learning apparatus as described above for LLR value estimation may be applied to estimate reference threshold voltage value. The same input metrics described above also carry information on the voltage offset δ 1206. The same neural network structure (e.g., as shown in FIG. 7) as for LLR value estimation can be applied for offset δ 1206 estimation including the same input layer, with modification only at the output layer 704. As illustrated above in relation to SLC memory, TLC memory with a LSB read, and TLC memory with a CSB memory, the total number of reference threshold voltage values differs depending on the memory cell type (i.e., SLC, MLC, TLC, QLC etc.) and read type (LSB, CSB, MSB, etc.). Using TLC as example, there are seven reference threshold voltages ($R_1$, $R_2$, ... $R_7$) used to read different page types.

Figure 13:
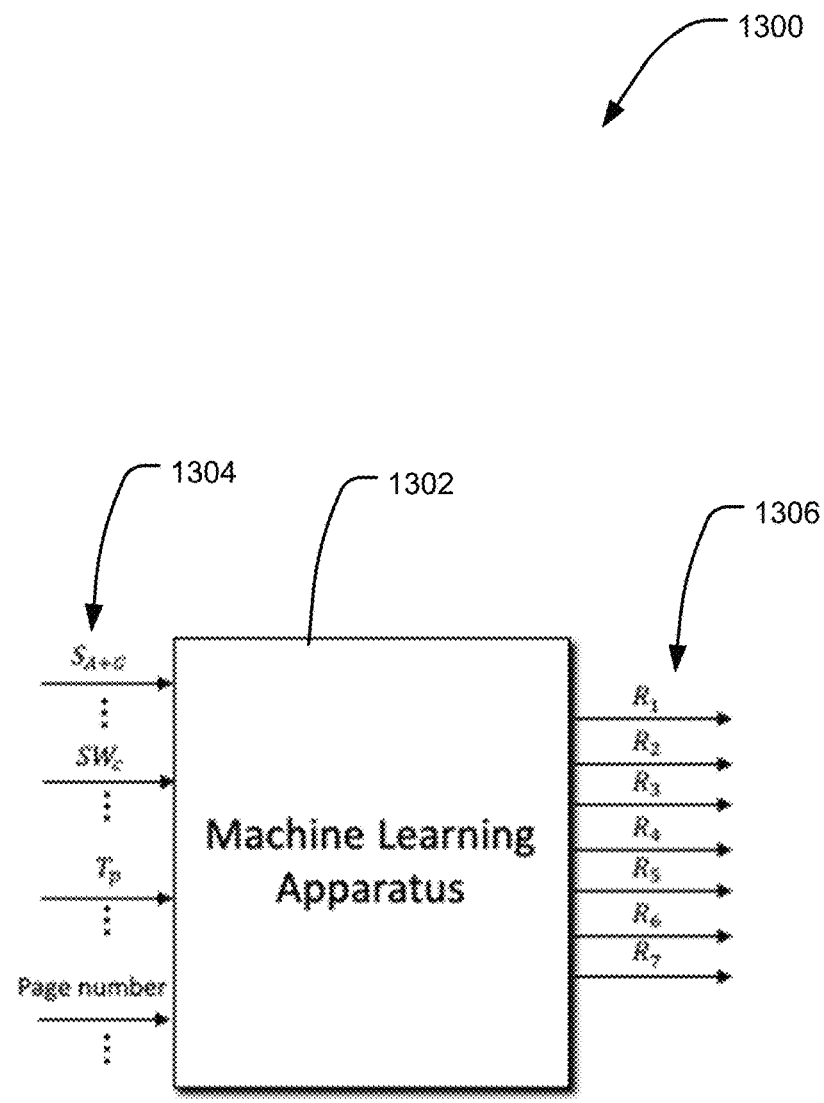
FIG. 13 illustrates an example machine learning apparatus for receiving inputs related to a codeword to be read and that outputs a plurality of reference threshold voltage values related to the codeword.

FIG. 13 illustrates a machine learning apparatus 1302 configured to determine reference threshold voltage values for a TLC memory cell. As shown in FIG. 13, the number of outputs 1306 for the neural network of the machine learning apparatus 1302 may be set to be the same as the total number of reference threshold voltages, e.g. seven for TLC. This may allow an output 1306 to be provided for the estimation of each relevant individual reference threshold voltage value for each bit state of the TLC memory cell. Training data may also be labeled with the correct offset δ 1206. Depending on the page type, only a subset of the seven thresholds may be involved in reading process. For example, a LSB page may only apply $R_1$ and $R_5$, CSB page $R_2$, $R_4$, and $R_6$, MSB page $R_3$ and $R_7$. For the thresholds that are involved in reading, the offset δ 1206 can be obtained by taking the difference between the optimal reference threshold voltage value 1204 and applied reference threshold voltage value 1206. For the reference threshold voltage values that are not used for the current page type, the offset may be set to 0. That is, relevant reference threshold voltage values may be identified for the read type such that only reference threshold voltage values for bit states of interest may be estimated. For example, for a LSB page, the output labeling may look like [−4,0,0,0,3, 0,0]. An individual machine learning algorithm may also be applied for each page type (i.e. LSB, CSB, MSB). In this case, the outputs of the machine learning algorithm may be the reference threshold voltage values that are relevant to the current page type (e.g. only R1 and R5 for LSB). In this case, there is no need to set the irrelevant reference threshold voltage values to 0. In other words, each page type may have a dedicated machine learning algorithm to predict a subset of reference threshold voltages relevant for the given page type. As with performance of the machine learning apparatus shown above in estimating LLR values, performance of a machine learning apparatus for estimation of reference threshold voltage values has been demonstrated to far exceed approaches using polynomial curve fitting or static values.

Figure 14:
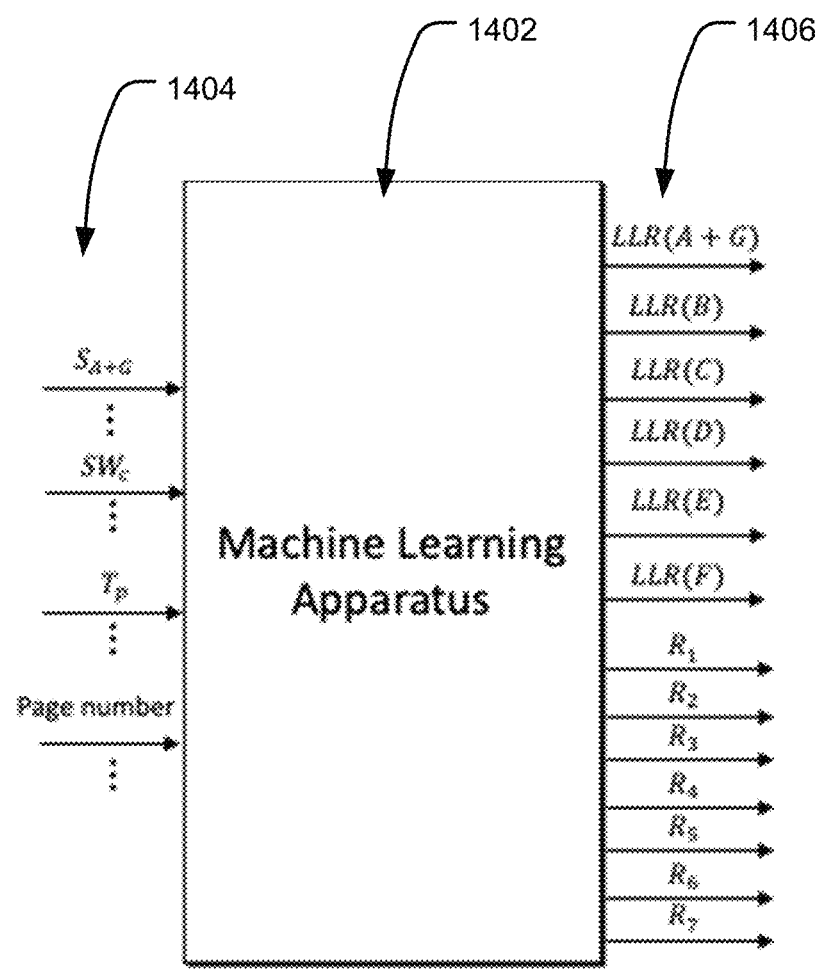
FIG. 14 illustrates an example machine learning apparatus for receiving inputs related to a codeword to be read and that outputs a plurality of reference threshold voltage values and a plurality of LLR values related to the codeword.

Further still, a given machine learning apparatus may provide estimates for both reference threshold voltage values and LLR values. One such example is shown in FIG. 14. FIG. 14 includes a machine learning apparatus 1402, which may employ a neural network as described above. As may be appreciated, the inputs 1404 for both LLR value estimation and reference threshold voltage value estimation may be the same. Specifically, the inputs 1404 may at least include signal count metrics and syndrome weights. As such, the outputs 1406 may include both LLR values for the memory cell to be read as well as relevant reference threshold voltage values. Specifically, both LLR values and reference threshold voltage value estimations are important in the error recovery process of a solid-state memory device such as flash memory. While individual estimation of the reference threshold voltage value or LLR values can be done with two individual neural networks as shown above, an alternative is to use a single neural network to estimate both the reference threshold voltage value and LLR values. In the context of a combined estimation of LLR values and reference threshold voltage values, the hyper-parameters of the neural network may be specific to the combined reference threshold voltage value and LLR values estimation. Because more outputs 1406 are added, the size of the hidden layer may be increased as compared to individual estimation models.

Regarding the cost function for the neural network, a mean squared error function is a common choice. By default, the overall cost of the neural network may be the summation of the mean squared errors of all the estimates, as shown in Equation 2 below, where a represents the regions partitioned by the multiple reads:

$$\text{overall cost} = \Sigma_a \text{mse}(\text{LLR}(a)) + \Sigma_i \text{mse}(R_i) \qquad \text{Equation 2}$$

Weight values can be applied in the cost function to improve the overall performance as following:

$$\text{overall cost} = w_1 \Sigma_a \text{mse}(\text{LLR}(a)) + w_2 \Sigma_i \text{mse}(R_i) \qquad \text{Equation 3}$$

where $w_1$ and $w_2$ are the weights for LLR value and reference threshold voltage value estimation, respectively. In this regard, the LLR value cost and the reference threshold voltage value cost may be individually weighted. Because the error recovery performance may be more sensitive to the estimation errors of reference threshold voltages than that of LLR values, a larger weight may be assigned to reference threshold voltage outputs ($w_2$), in order to boost the estimation accuracy of reference threshold voltage and hence the overall error recovery performance.

Figure 15:
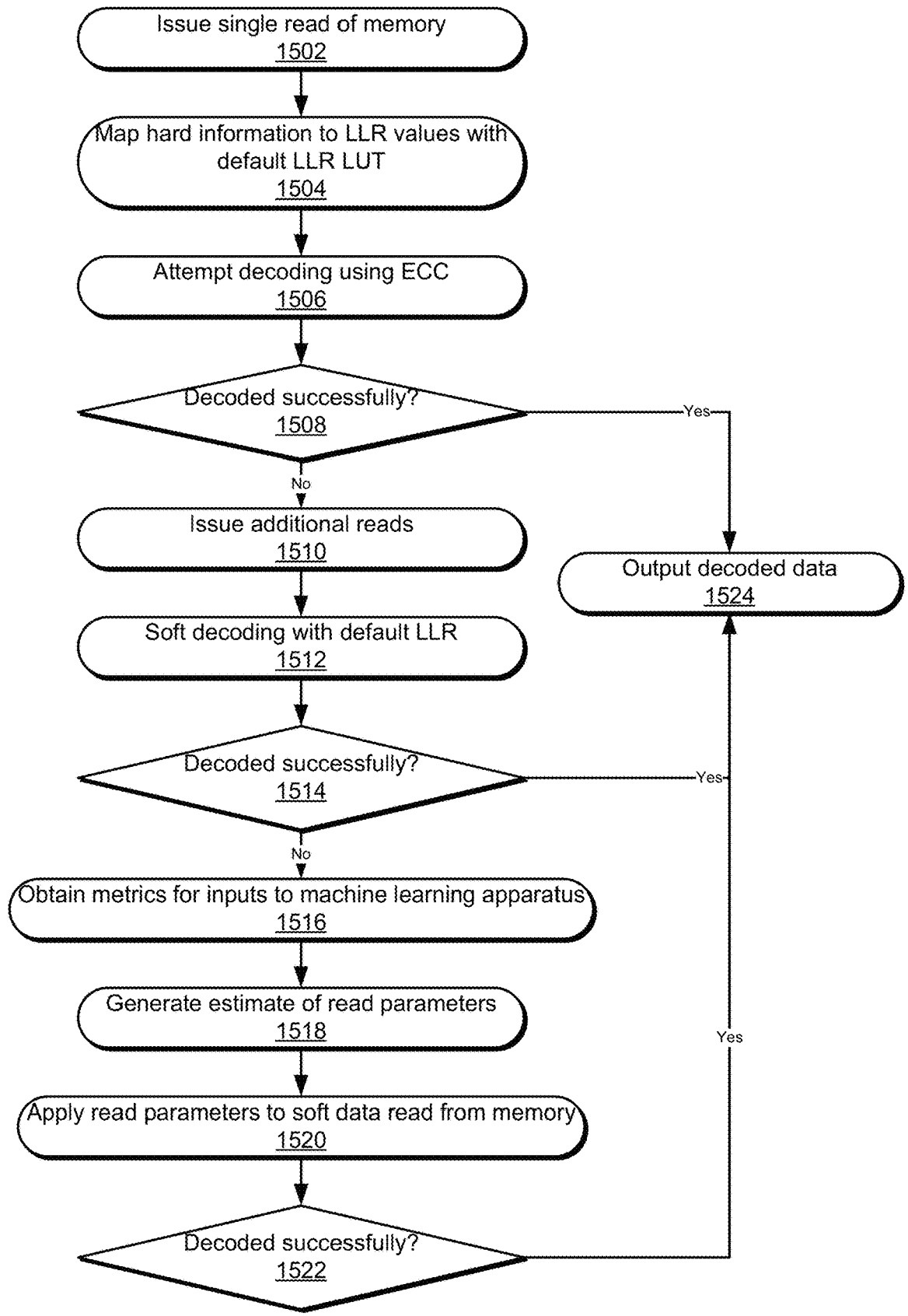
FIG. 15 illustrates example operations for reading data from a solid-state memory device using a read channel with read channel parameters.

FIG. 15 illustrates example operations 1500 for data recovery from a memory cell. The operations 1500 may include a read operation 1502 in which a read command is issued to the memory cell. The read operation 1502 may include issuing a single read command to the memory using default reference threshold voltage value(s) (depending on memory cell type and read type as discussed above) in an attempt to read the data from memory. The operations 1500 may include a mapping operation 1504 in which hard data read in the read operation 1502 is mapped to default LLR values in a default LLR LUT. In turn, a LLR sequence may be provided to an ECC decoder which may perform a decoding operation 1506. In the decoding operation 1506, the LLR sequence from the mapping operation 1504. A determination operation 1508 determines if the ECC decoder successfully decodes the codeword. If decoding is successful, the operations 1500 may include an outputting operation 1524 in which the decoded codeword is provided in response to the read command.

In contrast, if the decoding operation 1506 is determined to be unsuccessful at the determination operation 1508, a subsequent read operation 1510 may be issued in which additional read operations are issued to the memory cell. The read operation 1510 may issue multiple read commands to the memory to generate soft read data. The soft data from the read operation 1510 may be mapped to an LLR sequence using the default LLR lookup table as was conducted in the mapping operation 1504. A soft decoding operation 1512 may be performed to attempt to decode the codeword from the soft data mapped to the default LLR values. A determination operation 1514 may determine if the soft decoding operation was successful in decoding the codeword. If the determining operation 1514 determines the soft decoding operation 1512 was successful, the decoded data may be output in the outputting operation 1524.

If the determining operation 1514 determines that the soft decoding operation 1512 fails, the operation 1500 may include an obtaining operation 1516 in which the metrics for use as input to a machine learning apparatus are obtained. This may include collecting signal count metrics for regions in the signal space of the memory as described above. Moreover, syndrome weights (e.g., from the decoding operation 1506 and/or soft decoding operation 1506) may be determined. As such, an estimating operation 1518 may be conducted that include execution of a machine learning approach to estimate the read parameters (e.g., LLR values and/or relevant reference threshold voltage value(s)). Once the estimating operation 1518 generates an estimate of read parameters, a read operation 1520 may be performed. The read operation 1520 may utilize the estimated reference threshold voltage value(s) from the estimating operation 1518 when issuing read commands to the memory. The read operation 1520 may also include mapping soft data read from the memory using estimated LLR values obtained during the estimating operation 1518. The read operation 1520 may include applying an ECC to the LLR sequence that has been obtained using the estimated reference threshold voltage values and/or LLR values from the estimating operation 1518. In turn, a determining operation 1522 may determine if the codeword is successfully decoded. If so, the operations 1500 may include performing the outputting operation 1524 to output the decoded data. If the determining operation 1522 continues to fail to decode the codeword, advanced error recover techniques may be implemented including, for example, memory rebuilding using parity data (e.g., RAID operations), backup data recover, or the like.

Figure 16:
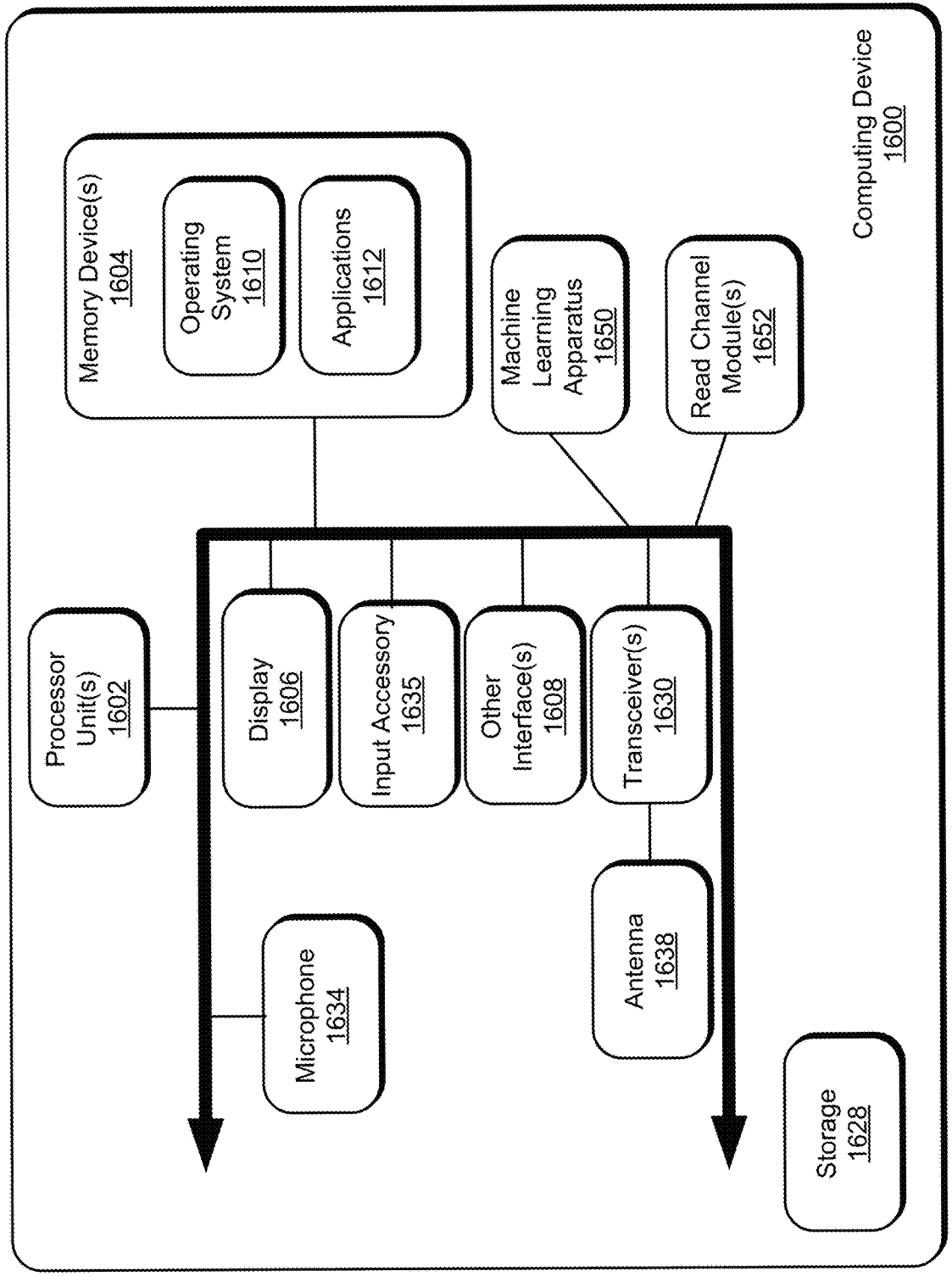
FIG. 16 illustrates an example computing device for execution of functionality of the present disclosure.

FIG. 16 illustrates an example schematic of a computing device 1600 suitable for implementing aspects of the disclosed technology including a machine learning apparatus 1650 and/or read channel modules 1652 as described above. The computing device 1600 includes one or more processor unit(s) 1602, memory 1604, a display 1606, and other interfaces 1608 (e.g., buttons). The memory 1604 generally includes both volatile memory (e.g., RAM) and non-volatile memory (e.g., flash memory). An operating system 1610, such as the Microsoft Windows® operating system, the Apple macOS operating system, or the Linux operating system, resides in the memory 1604 and is executed by the processor unit(s) 1602, although it should be understood that other operating systems may be employed.

One or more applications 1612 are loaded in the memory 1604 and executed on the operating system 1610 by the processor unit(s) 1602. Applications 1612 may receive input from various input local devices such as a microphone 1634, input accessory 1635 (e.g., keypad, mouse, stylus, touchpad, joystick, instrument mounted input, or the like). Additionally, the applications 1612 may receive input from one or more remote devices such as remotely-located smart devices by communicating with such devices over a wired or wireless network using more communication transceivers 1630 and an antenna 1638 to provide network connectivity (e.g., a mobile phone network, Wi-Fi®, Bluetooth®). The computing device 1600 may also include various other components, such as a positioning system (e.g., a global positioning satellite transceiver), one or more accelerometers, one or more cameras, an audio interface (e.g., the microphone 1634, an audio amplifier and speaker and/or audio jack), and storage devices 1628. Other configurations may also be employed.

The computing device 1600 further includes a power supply 1616, which is powered by one or more batteries or other power sources and which provides power to other components of the computing device 1600. The power supply 1616 may also be connected to an external power source (not shown) that overrides or recharges the built-in batteries or other power sources.

In an example implementation, the computing device 1600 comprises hardware and/or software embodied by instructions stored in the memory 1604 and/or the storage devices 1628 and processed by the processor unit(s) 1602. The memory 1604 may be the memory of a host device or of an accessory that couples to the host. Additionally or alternatively, the computing device 1600 may comprise one or more field programmable gate arrays (FPGAs), application specific integrated circuits (ASIC), or other hardware/software/firmware capable of providing the functionality described herein.

The computing device 1600 may include a variety of tangible processor-readable storage media and intangible processor-readable communication signals. Tangible processor-readable storage can be embodied by any available media that can be accessed by the computing device 1600 and includes both volatile and nonvolatile storage media, removable and non-removable storage media. Tangible processor-readable storage media excludes intangible communications signals and includes volatile and nonvolatile, removable and non-removable storage media implemented in any method or technology for storage of information such as processor-readable instructions, data structures, program modules or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 1600. In contrast to tangible processor-readable storage media, intangible processor-readable communication signals may embody processor-readable instructions, data structures, program modules or other data resident in a modulated data signal, such as a carrier wave or other signal transport mechanism. The term "modulated data signal" means an intangible communications signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Some implementations may comprise an article of manufacture. An article of manufacture may comprise a tangible storage medium to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

One general aspect of the present disclosure includes a method for estimating read channel parameters of a read channel in a solid-state storage device. The method includes determining signal count metrics associated with a codeword read from a solid-state storage device and obtaining a syndrome weight of an error correction code of a decoder of the read channel for the codeword. In turn, the method includes applying a machine learning technique having at least the signal count metrics and the syndrome weight as inputs to estimate one or more read channel parameters specific to the codeword as a result of the machine learning technique. The method also includes reading data of the codeword from the read channel of the solid-state storage device using the one or more read channel parameters.

Implementations may include one or more of the following features. For example, the method may include determining at least one of a test condition or a page ID for the codeword. The at least one of the test condition or the page ID may be provided as a further input to the machine learning technique. The test condition may include at least one of a program temperature of the data read from the solid-state storage device, a read temperature of the data read from the solid-state storage device, data retention time, or a program/erase cycle identifier. The page ID may include a page number or a page type.

In an example, the read channel parameters may include at least one reference threshold voltage and a plurality of log-likelihood ratio values for the codeword. The reference threshold voltage and the plurality of log-likelihood ratio values may include outputs of a common machine learning technique. Cost functions for each of the reference voltage and the plurality of log-likelihood ratio values may be individually weighted in the machine learning technique.

In an example, the estimation of the read channel parameters may be conducted in response to an unsuccessful decoding of the codeword using an error correction code.

Another general aspect of the present disclosure includes a solid-state storage device for estimating read channel parameters of a read channel in the solid-state storage device. The device includes a read channel circuit operative to read soft data from the solid-state storage device to determine signal count metrics associated with a codeword read from the solid-state storage device. The device also includes an error correction decoder operative to apply an error correction code to the soft data to attempt to decode the codeword from the soft data. When the error correction decoder fails to decode the codeword from the soft data, the error correction decoder obtains a syndrome weight of the error correction code. The device also includes a machine learning module operative to execute a machine learning technique having at least the signal count metrics and the syndrome weight as inputs to estimate one or more read channel parameters specific to the codeword as a result of the machine learning technique. The machine learning module communicates the one or more read channel parameters specific to the codeword to the read channel circuit to read data of the codeword from the read channel of the solid-state storage device using the one or more read channel parameters.

Implementations may include one or more of the following features. For example, the machine learning module may also receive at least one of a test condition or a page ID for the codeword. The at least one of the test condition or the page ID may be further input to the machine learning technique executed by the machine learning module. The test condition may include at least one of a program temperature of the data read from the solid-state storage device, a read temperature of the data read from the solid-state storage device, data retention time, or a program/erase cycle identifier. The page ID may include a page number or a page type.

In an example, the read channel parameters may include at least one reference threshold voltage and a plurality of log-likelihood ratio values for the codeword. The reference threshold voltage and the plurality of log-likelihood ratio values may be outputs of a common machine learning technique. Cost functions for each of the reference voltage and the plurality of log-likelihood ratio values are individually weighted in the machine learning technique.

In an example, the machine learning module may execute the machine learning technique for estimation of the read channel parameters in response to an unsuccessful decoding of the codeword by the error correction decoder.

Another general aspect of the present disclosure includes one or more tangible processor-readable storage media embodied with instructions for executing on one or more processors and circuits of a device a process for estimating read channel parameters of a read channel in a solid-state storage device. The process includes determining signal count metrics associated with a codeword read from a solid-state storage device and obtaining a syndrome weight of an error correction code of a decoder of the read channel for the codeword. The process also includes applying a machine learning technique having at least the signal count metrics and the syndrome weight as inputs to estimate one or more read channel parameters specific to the codeword as a result of the machine learning technique. The process also includes reading data of the codeword from the read channel of the solid-state storage device using the one or more read channel parameters.

Implementations may include one or more of the following features. For example, the process may also include determining at least one of a test condition or a page ID for the codeword. The at least one of the test condition or the page ID may be a further input to the machine learning technique. The test condition may include at least one of a program temperature of the data read from the solid-state storage device, a read temperature of the data read from the solid-state storage device, data retention time, or a program/erase cycle identifier. The page ID may include a page number or a page type.

In an example, the read channel parameters include at least one reference threshold voltage and a plurality of log-likelihood ratio values for the codeword. The reference threshold voltage and the plurality of log-likelihood ratio values may include outputs of a common machine learning technique. Cost functions for each of the reference voltage and the plurality of log-likelihood ratio values are individually weighted in the machine learning technique.

In an example, the estimation of the read channel parameters may be conducted in response to an unsuccessful decoding of the codeword using an error correction code.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed is:

1. A method for estimating read channel parameters of a read channel in a solid-state storage device, comprising:
   determining signal count metrics associated with a codeword read from a solid-state storage device;
   obtaining a syndrome weight of an error correction code of a decoder of the read channel for the codeword;
   applying a machine learning technique having at least the signal count metrics and the syndrome weight as inputs to estimate one or more read channel parameters specific to the codeword as a result of the machine learning technique; and
   reading data of the codeword from the read channel of the solid-state storage device using the one or more read channel parameters.

2. The method of claim 1, further comprising:
   determining at least one of a test condition or a page ID for the codeword, wherein the at least one of the test condition or the page ID comprises a further input to the machine learning technique.

3. The method of claim 2, wherein the test condition comprises at least one of a program temperature of the data read from the solid-state storage device, a read temperature of the data read from the solid-state storage device, data retention time, or a program/erase cycle identifier.

4. The method of claim 2, wherein the page ID comprises a page number or a page type.

5. The method of claim 1, wherein the read channel parameters comprise at least one reference threshold voltage and a plurality of log-likelihood ratio values for the codeword.

6. The method of claim 5, wherein the reference threshold voltage and the plurality of log-likelihood ratio values comprise outputs of a common machine learning technique, and wherein cost functions for each of the reference voltage and the plurality of log-likelihood ratio values are individually weighted in the machine learning technique.

7. The method of claim 1, wherein the estimation of the read channel parameters is conducted in response to an unsuccessful decoding of the codeword using an error correction code.

8. A solid-state storage device for estimating read channel parameters of a read channel in the solid-state storage device, comprising:
   a read channel circuit operative to read soft data from the solid-state storage device to determine signal count metrics associated with a codeword read from the solid-state storage device;
   an error correction decoder operative to apply an error correction code to the soft data to attempt to decode the codeword from the soft data, wherein when the error correction decoder fails to decode the codeword from the soft data, the error correction decoder obtains a syndrome weight of the error correction code;
   a machine learning module operative to execute a machine learning technique having at least the signal count metrics and the syndrome weight as inputs to estimate one or more read channel parameters specific to the codeword as a result of the machine learning technique; and
   wherein the machine learning module communicates the one or more read channel parameters specific to the codeword to the read channel circuit to read data of the codeword from the read channel of the solid-state storage device using the one or more read channel parameters.

9. The device of claim 8, wherein the machine learning module further receives at least one of a test condition or a page ID for the codeword, wherein the at least one of the test condition or the page ID comprises a further input to the machine learning technique executed by the machine learning module.

10. The device of claim 9, wherein the test condition comprises at least one of a program temperature of the data read from the solid-state storage device, a read temperature of the data read from the solid-state storage device, data retention time, or a program/erase cycle identifier.

11. The device of claim 9, wherein the page ID comprises a page number or a page type.

12. The device of claim 9, wherein the read channel parameters comprise at least one reference threshold voltage and a plurality of log-likelihood ratio values for the codeword.

13. The device of claim 12, wherein the reference threshold voltage and the plurality of log-likelihood ratio values comprise outputs of a common machine learning technique, and wherein cost functions for each of the reference voltage and the plurality of log-likelihood ratio values are individually weighted in the machine learning technique.

14. The device of claim 9, wherein the machine learning module executes the machine learning technique for estimation of the read channel parameters in response to an unsuccessful decoding of the codeword by the error correction decoder.

15. One or more tangible processor-readable storage media embodied with instructions for executing on one or more processors and circuits of a device a process for estimating read channel parameters of a read channel in a solid-state storage device, comprising:
   determining signal count metrics associated with a codeword read from a solid-state storage device;
   obtaining a syndrome weight of an error correction code of a decoder of the read channel for the codeword;
   applying a machine learning technique having at least the signal count metrics and the syndrome weight as inputs to estimate one or more read channel parameters specific to the codeword as a result of the machine learning technique; and
   reading data of the codeword from the read channel of the solid-state storage device using the one or more read channel parameters.

16. The one or more tangible processor-readable storage media of claim 15, wherein the process further comprises:
   determining at least one of a test condition or a page ID for the codeword, wherein the at least one of the test condition or the page ID comprises a further input to the machine learning technique.

17. The one or more tangible processor-readable storage media of claim 16, wherein the test condition comprises at least one of a program temperature of the data read from the solid-state storage device, a read temperature of the data read from the solid-state storage device, data retention time, or a program/erase cycle identifier and the page ID comprises a page number or a page type.

18. The one or more tangible processor-readable storage media of claim 15, wherein the read channel parameters comprise at least one reference threshold voltage and a plurality of log-likelihood ratio values for the codeword.

19. The one or more tangible processor-readable storage media of claim 18, wherein the reference threshold voltage and the plurality of log-likelihood ratio values comprise outputs of a common machine learning technique, and wherein cost functions for each of the reference voltage and the plurality of log-likelihood ratio values are individually weighted in the machine learning technique.

20. The one or more tangible processor-readable storage media of claim 14, wherein the estimation of the read channel parameters is conducted in response to an unsuccessful decoding of the codeword using an error correction code.

\* \* \* \* \*